(12) United States Patent
Keramat et al.

(10) Patent No.: US 8,400,746 B1
(45) Date of Patent: Mar. 19, 2013

(54) BYPASS CAPACITOR WITH REDUCED LEAKAGE CURRENT AND POWER-DOWN CONTROL

(75) Inventors: Mansour Keramat, Santa Clara, CA (US); Sudharsan Kanagaraj, Santa Clara, CA (US)

(73) Assignee: Integrated Device Technology, Inc., San Jose, CA (US)

(*) Notice: Subject to any disclaimer, the term of this patent is extended or adjusted under 35 U.S.C. 154(b) by 122 days.

(21) Appl. No.: 12/956,808

(22) Filed: Nov. 30, 2010

(51) Int. Cl.
*H02H 3/22* (2006.01)
(52) U.S. Cl. .................................................... 361/111
(58) Field of Classification Search ............ 361/111
See application file for complete search history.

(56) References Cited

U.S. PATENT DOCUMENTS

| | | | | |
|---|---|---|---|---|
| 6,735,072 | B2* | 5/2004 | Liao | 361/306.2 |
| 7,656,177 | B2* | 2/2010 | Seki | 324/754.08 |
| 7,884,666 | B1* | 2/2011 | Welland et al. | 327/558 |
| 2003/0076138 | A1* | 4/2003 | Hwang | 327/143 |
| 2003/0193771 | A1* | 10/2003 | Liao | 361/306.2 |
| 2007/0127169 | A1* | 6/2007 | Nguyen | 361/15 |
| 2008/0174318 | A1* | 7/2008 | Seki | 324/537 |

* cited by examiner

*Primary Examiner* — Ronald W Leja
(74) *Attorney, Agent, or Firm* — Heimlich Law, PC; Alan Heimlich, Esq.

(57) ABSTRACT

An integrated circuit is disclosed to bypass transients between first and second nodes. The circuit includes a first bypass capacitor implemented as a metal oxide semiconductor (MOS) transistor and coupled to a first node; and a switch coupled to the first bypass capacitor and the second node, the switch preventing leakage current from passing through the first bypass capacitor during power down.

19 Claims, 3 Drawing Sheets

BYPASS CAPACITOR WITH REDUCED LEAKAGE CURRENT AND POWER-DOWN CONTROL

BACKGROUND

The present invention relates to an integrated circuit bypass capacitor with reduced leakage current and power-down control.

Advances in semiconductor technology have resulted in powerful, yet small appliances for mobile applications. To ensure long operation, minimizing power dissipation is important. For portable electronic devices this equates to maximizing battery life. For example, mobile phones need to be powered for extended periods (known as standby mode, during which the phone is able to receive an incoming call), but are fully active for much shorter periods (known as talk or active mode, while making a call). When an electronic device such as a mobile phone is in standby mode, certain portions of the circuitry within the electronic device, which are active when the phone is in talk mode, are shut down. These circuits, however, still dissipate power consumption through leakage currents, even though they are inactive. Even if the leakage current is much smaller than the normal operating current of the circuit, the leakage current depletes the battery charge over the relatively long standby time, whereas the operating current during talk time only depletes the battery charge over the relatively short talk time. As a result, the leakage current has a disproportional effect on total battery life, making leakage current an important design constraint.

One common component used in discrete as well as IC circuits is a bypass capacitor. The bypass capacitor is generally employed to conduct an alternating (AC) current around a component or group of components. The bypass capacitor provides a short circuit pass for high-frequency AC components and allows only the DC component pass through the bypassed component. These capacitors are widely used on analog and digital chips. For most such applications, having a solid constant DC voltage as a power supply or bias is essential. Any variations and fluctuations on the supply or bias voltages cause issues for operation of most analog and digital blocks. This is especially true for analog blocks, where any such unwanted fluctuations or variations can cause major disruptions in the operation of the circuit. Such variations and fluctuations can be effectively filtered using bypass capacitors. These capacitors dampen the fluctuations as AC components and provide the required filtering effect which helps keep the voltages across the chip constant, minimizing the effects of fluctuations and noise.

One sensitive node (especially for analog blocks) is the voltage supply. Usually analog blocks are very sensitive to variations and noise on the voltage supply. Although in differential circuits this sensitivity is reduced, proper performance for many circuits depends on having a clean supply voltage VDD. Similarly digital and mixed signal circuits are dependent on a clean supply, especially for high frequency circuits where timing issues become of essence.

To provide a clean power supply for analog and digital components, one common practice is to cover all unused space on the chip around each individual block with bypass capacitors for the supply voltage. To maximize the area efficiency of the bypass capacitors, they are commonly implemented using metal oxide semiconductor (MOS) capacitors (MOSCAPs). These capacitors are implemented as transistors and take advantage of gate oxide of MOS devices.

Unlike metal-insulator-metal (MIM) capacitors and metal-on-metal (MOM) caps, the MOSCAP is highly non-linear with voltage and has more variability with process and temperature. The main advantage of MOSCAP is its high area density, which makes is most suitable for bypass purposes. Bypass capacitors are usually across constant voltage levels and the variations and exact capacitor values become less significant. Rather, a high capacitance is the main objective. For example, modern chips typically use bypass capacitance on the order of at least a few hundred pico-farads to a few nano-farads. As a result, the area efficiency of bypass capacitors dictates their implementation as MOSCAPs.

In modern deep sub-micron CMOS technology, however, the use of MOSCAPs as bypass capacitors can cause increased leakage and high power dissipation even if the chip is not running. As the gate oxide thickness decreases, the leakage across the gate oxide becomes more significant. The large size of the required bypass capacitor means that the capacitor needs to be implemented as a large transistor, where the gate leakage becomes even more significant. This is especially true at high voltage and high temperature. The leakage current through bypass capacitors becomes especially important in the power-down mode.

In the power-up mode where all the blocks are on, the main current consumption is dominated by the actual power consumption of such blocks. In the power-down mode, these blocks should be in the inactive or off state and the current consumption should be low. The leakage current, however, stays constant. Therefore, it can potentially become the dominant component in the power-down current of the IC.

Thus, reducing the leakage current of bypass capacitors becomes essential in modern semiconductor devices. One solution uses high-voltage devices which are usually available in the sub-micron processes for input/output purposes. These devices however do not have the low gate oxide thickness of the core devices and therefore have lower area density for providing a similar amount of bypass capacitance.

SUMMARY

In one aspect, an integrated circuit is disclosed to bypass transients between first and second nodes. The circuit includes a first bypass capacitor implemented as a metal oxide semiconductor (MOS) transistor and coupled to a first node; and a switch coupled to the first bypass capacitor and the second node, the switch preventing leakage current from passing through the first bypass capacitor during power down.

Implementations of the above aspect may include one or more of the following. The first node is a power rail (VDD) and the second node is ground. An inverter can be connected to a power down signal and drives a gate of the switch. After power up, the switch is on and adds to a series resistance of the first bypass capacitor. During power down, the switch is open and reduces leakage through the first bypass capacitor. The inverter drives a second bypass capacitor implemented as a MOS transistor to reduce transient noise. A power up signal controls a second bypass capacitor to reduce transient noise. The second bypass capacitor disconnects the first bypass capacitor during an electrostatic discharge (ESD). During an electrostatic discharge, the second bypass capacitor shorts power to a power down signal to turn off the switch and relieve stress on the first bypass capacitor. The first bypass capacitor is sized with a predetermined length to increase series resistance and reduce ringing in the first node. The switch is on after power up and adds to a series resistance of the MOS capacitor. A second bypass capacitor implemented as a MOS transistor can be positioned between the first and second nodes to provide bypass capacitance during power off.

The second bypass capacitor has a thick gate oxide to reduced leakage. The second bypass capacitor can be a thick gate oxide transistor. An array of bypass capacitors can be positioned in an unused area of the chip. The first bypass capacitor can be a PMOS capacitor with a predetermined length to increase series resistance and reduce ringing in a power rail.

In another aspect, a method bypasses transients in an integrated circuit device connected to a power rail and ground by implementing a metal oxide semiconductor (MOS) transistor as a first bypass capacitor having one end connected to a power rail; and a second end connected to a switch; and preventing leakage current from passing through the first bypass capacitor during power down by turning off the switch.

Implementations of the above aspect may include one or more of the following. The method includes implementing a second bypass capacitor as another MOS transistor, wherein the second bypass capacitor provides bypass capacitance during power off. The method also includes placing an array of bypass capacitors positioned in an unused area of the chip.

Advantages of the preferred embodiments may include one or more of the following. The design reduces the leakage current of the bypass capacitor during the power-down mode. The circuit provides the benefits of bypassing capacitance with a low overhead in area and power dissipated in the normal operation mode. The bypass capacitor cell provides a high-density bypass cap during normal power-up operation and preventing high leakage current during the power-off mode. The bypass capacitor can be used for decoupling is of a powered circuit from noise in the power supply. The bypass capacitors can shunt energy from those signals or transients past a sub-circuit to be decoupled, right to the return path. The system also suppresses switching noise. The bypass capacitors can be placed at each power source as well as at each analog component in order to ensure that the supplies are as steady as possible. Otherwise, an analog component with poor power supply rejection ratio (PSRR) will copy fluctuations in the power supply onto its output. The bypass capacitors provide an alternate path for high-frequency signals that would otherwise cause the normally steady supplies to move. Those components that require quick injections of current can bypass the power supply by receiving the current from the nearby capacitor. Hence, the slower power supply connection is used to charge these capacitors, and the capacitors actually provide the large quantities of high-availability current.

BRIEF DESCRIPTION OF THE DRAWINGS

An appreciation of the features and benefits of the present invention and a more complete understanding of its structure may be had by studying the following description of the preferred embodiment and by referring to the accompanying drawings.

DESCRIPTION

The term "NFET" refers to an N-type metal oxide semiconductor field effect transistor. Likewise, when used herein, "PFET" refers to a P-type metal oxide semiconductor field effect transistor. It should be appreciated that whenever the terms, "NFET", "PFET", and "transistor," are used, unless otherwise expressly indicated or dictated by the nature of their use, they are being used in an exemplary manner. They encompass the different varieties of MOS devices including devices that don't literally use "metal", i.e., using another suitable material in place of metal such as polysilicon, and devices with different VTs and oxide thicknesses to mention just a few. Moreover, unless specifically referred to as MOS or the like, the term transistor can include other suitable transistor types, e.g., junction-field-effect transistors, bipolar junction transistors, and various types of multi-gated transistors, known today or not yet developed.

Figure 1:
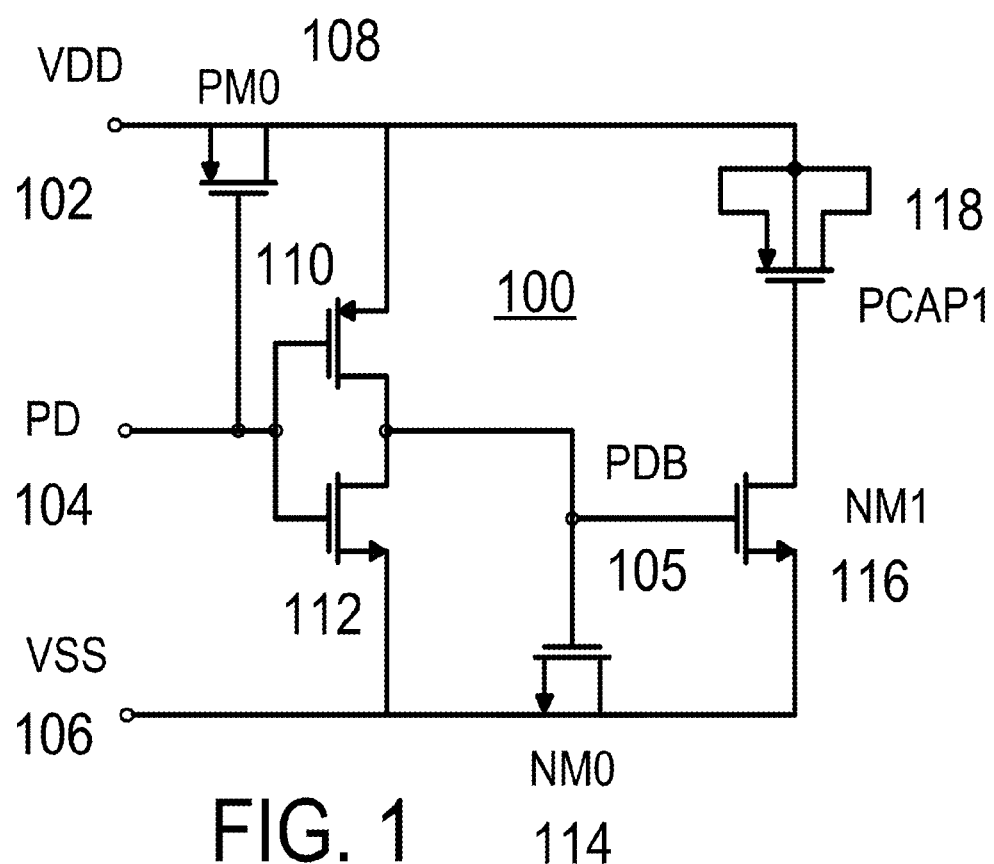
FIG. 1 shows an exemplary bypass capacitor unit cell.

FIG. 1 shows an exemplary bypass capacitor unit cell 100. Capacitor unit cell 100 is connected between VDD rail 102 and VSS rail 106. PD (power down) signal 104 is connected to transistors 110 and 112 forming an inverter to generate PDB signal 105. PDB signal 105 is provided to NMOS switches NM0 114 and NM1 116. NMOS switch NM1 116 is on during the power-up mode as PD 104=0 and PDB 105=1, connecting a first (or main) bypass capacitor PCAP1 118 across VDD rail 102 and VSS rail 106. The resistance of the switch NM1 116 further increases the series resistance of the bypass cap unit cell 100 which is beneficial for avoiding ringing issues previously mentioned. The resistance however cannot be set too high as the effectiveness of the bypass cap decreases with increased series resistance.

During a power-down mode, the gate of switch NM1 116 goes low, turning off the switch and preventing leakage current from passing through the first or main bypass capacitor PCAP1 118. The effects of transient voltage variations and noise on the gate of switch NM 1 116 is improved by adding small supplemental bypass capacitors NM0 114 and PM0 108 to nodes PDB 105 and PD 104. The size of these bypass capacitors is determined by the unused area in the cell layout.

In one embodiment, unit cell 100 can be repeated in an array to fill an unused area of the chip. The bypass capacitor PCAP1 118 is implemented as a PMOS device. The bypass is shown between the power supply rail VDD 102 and ground rail VSS 106, although it can be used to bypass any other voltage level as well. The PMOS device of PCAP1 118 is implemented with a large gate length (approximately 4 um) device. This is done to increase the series resistance of the first bypass capacitor PCAP1 118 to alleviate the possible ringing issues with the inductance of bond wires bringing the supply voltages onto the chip.

Figure 2:
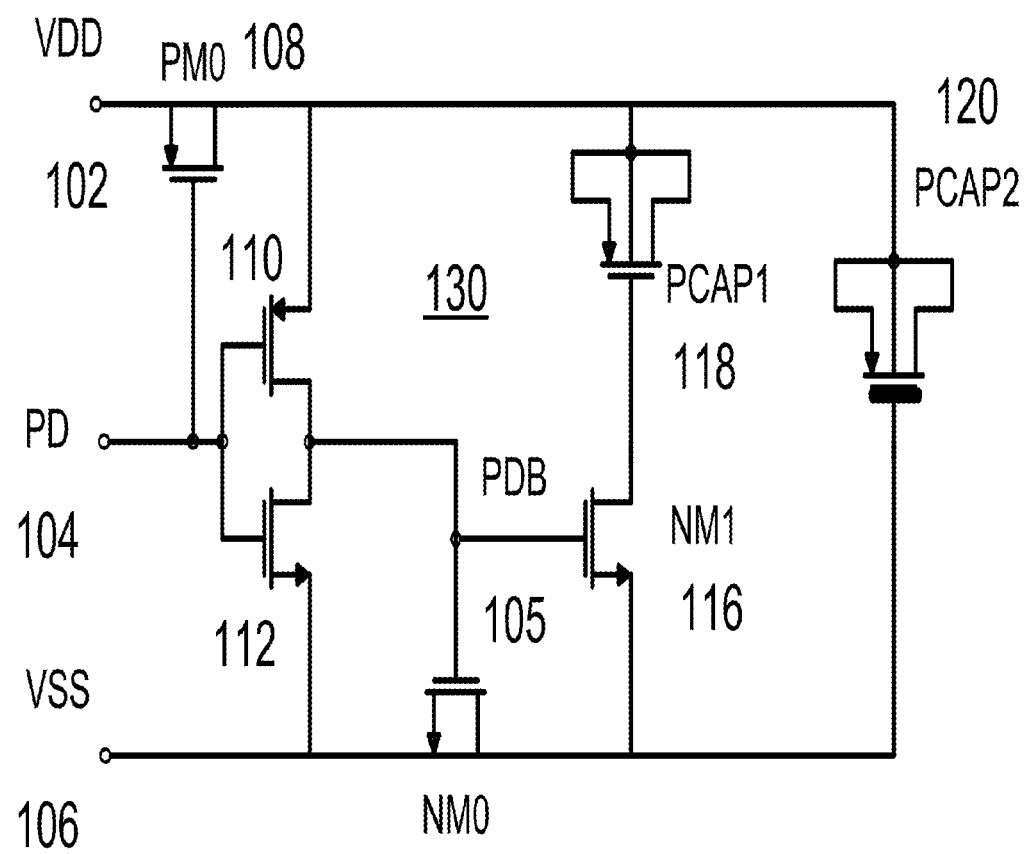
FIG. 2 shows another exemplary bypass capacitor unit cell with additional bypass capacitors.

FIG. 2 shows a second embodiment of a bypass capacitor unit cell 130. In order to provide some bypass capacitance during the power-off state, a high-voltage PMOS device PCAP2 120 can be optionally added in the bypass structure. The use of high-voltage device avoids any leakage related problems while providing some extra bypass cap. The length of the high-voltage device has also been chosen large (~4 um) in order to provide sufficient series resistance.

In particular, the PMOS cap PCAP1 118 is sized with appropriate length to increase series resistance and reduce ringing in VDD. After power up, switch NM1 116 is on and adds to the series resistance. However, the resistive load caused by switch NM1 116 cannot be too large as it reduces bypassing effect. During power down, switch NM1 116 is open and hence reduces leakage through bypass capacitor PCAP1 118. Transient noise on switch NM1 116 reduced by supplemental bypass capacitors NM0 114 and PM0 108. During an ESD zap, bypass capacitor PM0 108 shorts VDD to PD there by making PDB go low and turns off switch NM1 116. This relieves the main bypass capacitor PCAP1 118 from stress. In addition, the hybrid circuit of FIG. 2 has a second bypass capacitor PCAP2 120 with a thick gate oxide to serve as a bypass capacitor with reduced leakage.

Figure 3:
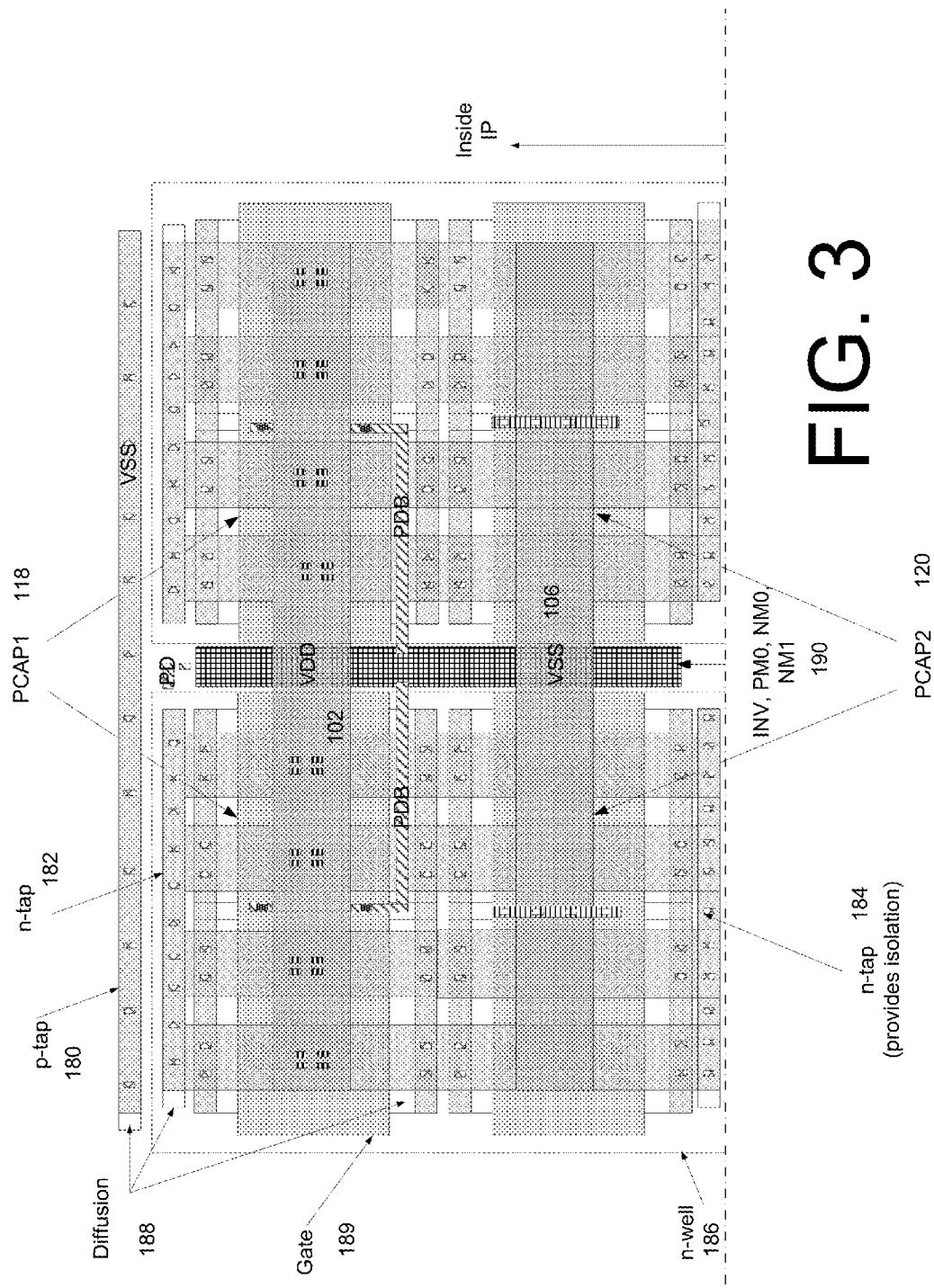
FIG. 3 shows an exemplary layout of the bypass capacitor unit cell of FIG. 2.

FIG. 3 shows an exemplary layout for the embodiment of FIG. 2. The PCAP1 118 is connected to power supply rail VDD 102 and NM1 116. PCAP2 120 connected to VDD 116 and ground VSS 106. The inverter, PM0, NM0 and NM1 are formed in a small block 190 that stretches along the width of an intellectual property (IP) block layout. A gate region 189 is formed above a diffusion layer 188 in an n-well 186.

The width of the n-tap 182-184 and the number of contacts on the n-tap 182-184 are chosen in an optimal fashion, which increases the resistance, thereby providing isolation to the analog power supply rail (AVDD) from external substrate noise. This embodiment is supplied as an intellectual property (IP) block that can be integrated with other IP blocks to form an integrated circuit.

It should be noted that FIG. 3 is intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

In summary, a bypass cap cell has been presented which provides a high-density bypass cap during normal power-up operation and preventing high leakage current during the power-off mode. The circuits of FIGS. 1-3 can be used for decoupling is of a powered circuit from signals in the power supply. The bypass capacitor can be used as a decoupling capacitor which can prevent the powered circuit from seeing that signal, thus decoupling it from that aspect of the power supply circuit.

The bypass capacitors in FIGS. 1-3 can shunt energy from those signals or transients past a sub-circuit to be decoupled, right to the return path. The system also suppresses switching noise. The bypass capacitors can be placed at each power source as well as at each analog component in order to ensure that the supplies are as steady as possible. Otherwise, an analog component with poor power supply rejection ratio (PSRR) will copy fluctuations in the power supply onto its output.

The bypass capacitors provide an alternate path for high-frequency signals that would otherwise cause the normally steady supplies to move. Those components that require quick injections of current can bypass the power supply by receiving the current from the nearby capacitor. Hence, the slower power supply connection is used to charge these capacitors, and the capacitors actually provide the large quantities of high-availability current.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the figures for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. An integrated circuit device to bypass transients between first and second nodes, comprising:
   a. a primary bypass capacitor implemented as a metal oxide semiconductor (MOS) transistor and coupled to the first node;
   b. a switch coupled to the primary bypass capacitor and the second node, the switch preventing leakage current from passing through the primary bypass capacitor during power down; and
   c. a power down signal coupled to an auxiliary bypass capacitor to reduce transient noise.

2. The circuit of claim 1, wherein the first node comprises a power rail and the second node comprises ground.

3. The circuit of claim 1, comprising an inverter coupled to said power down signal and drives a gate of the switch.

4. The circuit of claim 3, wherein after power up, the switch is on and adds resistance to a series resistance of the primary bypass capacitor.

5. The circuit of claim 3, wherein during power down, the switch is open and reduces leakage through the first bypass capacitor.

6. The circuit of claim 3, wherein the inverter drives an auxiliary bypass capacitor comprising a MOS transistor to reduce transient noise.

7. The circuit of claim 1, wherein the auxiliary bypass capacitor disconnects the first bypass capacitor during an electrostatic discharge (ESD).

8. The circuit of claim 1, wherein during an electrostatic discharge, the auxiliary bypass capacitor shorts power to a power down signal to turn off the switch and relieve stress on the first bypass capacitor.

9. The circuit of claim 1, wherein the first switch comprises a predetermined length to increase series resistance and reduce ringing in the first node.

10. The circuit of claim 1, wherein the switch is on after power up and adds to a series resistance of the MOS capacitor.

11. The circuit of claim 1, comprising a secondary bypass capacitor implemented as a MOS transistor and positioned between the first and second nodes to provide bypass capacitance during power off.

12. The circuit of claim 11, wherein the secondary bypass capacitor comprises a thick gate oxide to reduced leakage.

13. The circuit of claim 11, wherein the secondary bypass capacitor comprises a thick gate oxide transistor.

14. The circuit of claim 1, comprising an array of bypass capacitors positioned in an unused area of the chip.

15. The circuit of claim 1, wherein the primary bypass capacitor comprises a PMOS capacitor and a switch with a predetermined length to increase series resistance and reduce ringing in a power rail.

16. A method to bypass transients in an integrated circuit device connected to a power rail and ground, comprising:

a. implementing a metal oxide semiconductor (MOS) transistor as a primary bypass capacitor having one end connected to a power rail; and a second end connected to a switch;

b. preventing leakage current from passing through the primary bypass capacitor during power down by turning off the switch with a power down signal; and c. coupling said mower down signal to an auxiliary bypass capacitor to reduce transient noise.

17. The method of claim 16, comprising implementing a secondary bypass capacitor as another MOS transistor, wherein the second bypass capacitor provides bypass capacitance during power off.

18. The method of claim 17, wherein the auxiliary bypass capacitor disconnects the primary bypass capacitor during an electrostatic discharge (ESD).

19. The method of claim 17, comprising sizing the switch at a predetermined length to increase series resistance and reduce ringing in a first node.

* * * * *